DRIFT COMPENSATED DIRECT COUPLED AMPLIFIER
Filed Feb. 2, 1956
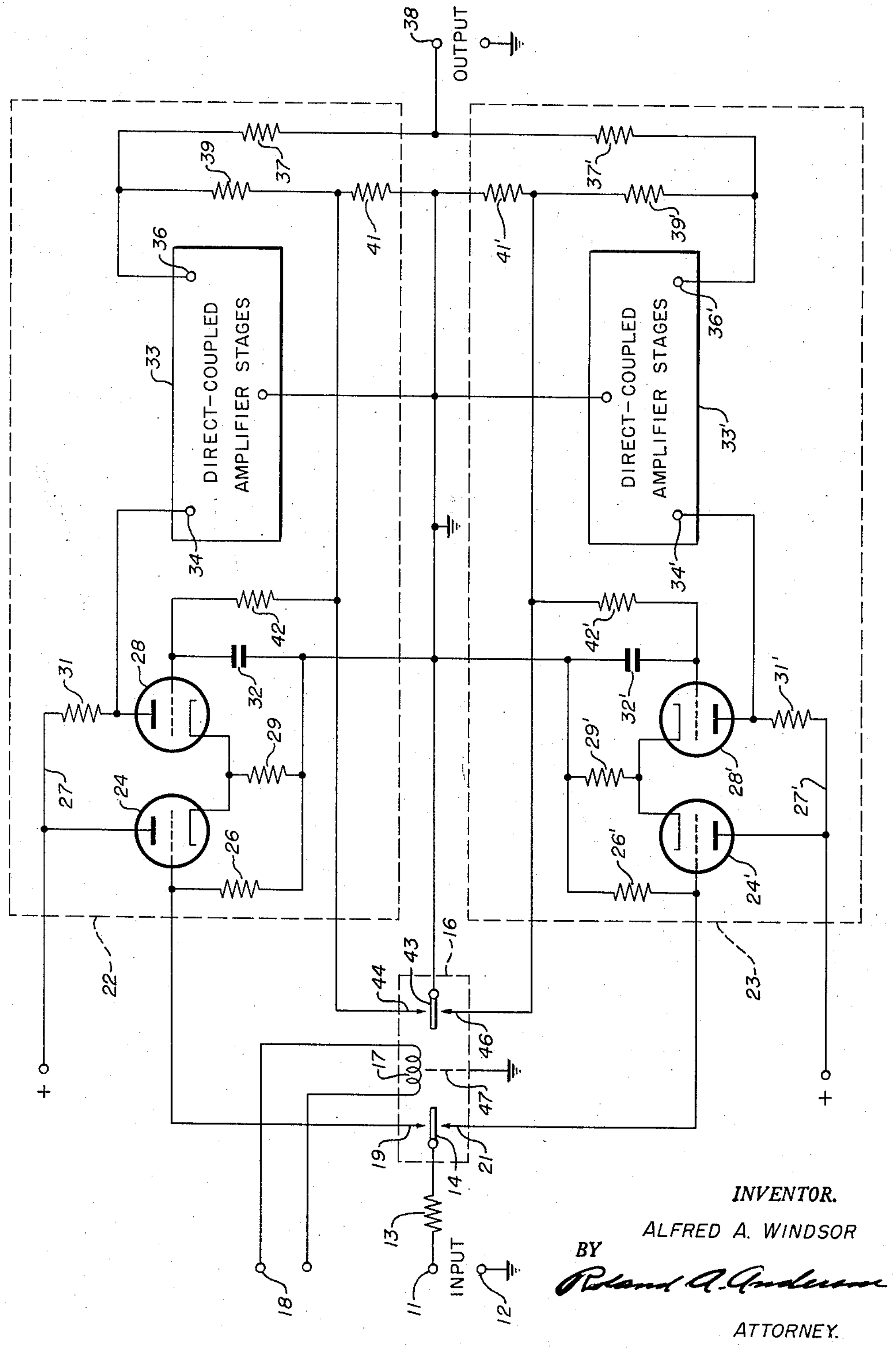
INVENTOR.
ALFRED A. WINDSOR
BY
Roland A. Anderson
ATTORNEY.

United States Patent Office 2,885,497

Patented May 5, 1959

2,885,497

DRIFT COMPENSATED DIRECT COUPLED AMPLIFIER

Alfred A. Windsor, Berkeley, Calif., assignor to the United States of America as represented by the United States Atomic Energy Commission Application February 2, 1956, Serial No. 563,160

1 Claim. (Cl. 179—171)

The present invention relates to direct-coupled amplifiers and, more particularly, to means for stabilizing the reference level of such amplifiers, such means having immunity from the saturation ordinarily created by high overload input potentials.

It is frequently desirable to amplify potentials of a steady state or direct current nature. One commonly occurring example is in direct current voltmeters for measurement of low amplitude direct current signals. The low amplitude signal must be amplified in a direct-coupled amplifier to a magnitude capable of actuating a measuring instrument. Such instruments generally must incorporate a zero adjustment so that the amplifier output will be zero when the input is zero. Such zero adjustment must be frequently altered to compensate for drift in the direct-coupled amplifier resulting from changes in temperature, power supply voltage, and tube emission. It does not appear practical to completely control or eliminate the conditions creating drift, therefore much effort has gone into the development of direct-coupled amplifiers where the zero adjustment is made automatically and frequently.

Normally, direct-coupled amplifier drift stability may be achieved through the use of a feedback arrangement, the amplifier input signal being periodically removed while drift in the amplifier is measured and corrective potentials applied. Generally the corrective potentials are amplified in a resistance-capacitance coupled amplifier before application to a control connection of the direct-coupled amplifier. Such a system is satisfactory until a large overload signal is applied to the input, then the resistance-capacitance networks in the alternating current amplifier become heavily charged and the amplifier is inoperative or applies an erroneous corrective potential to the direct-coupled amplifier for a short period following cessation of the overload. The corrective-potential amplifier might be made a direct-coupled amplifier, but then the problem arises of correcting for drift in the corrective-potential amplifier.

In the present invention the necessity for an auxiliary corrective-potential amplifier is eliminated, thereby also eliminating the deleterious effects of saturation when a high overload input potential is encountered. Stabilization for zero level drift is achieved through the use of a vibrator which periodically couples the amplifier input to a zero level or ground potential while the output is sampled for any drift and corrective potentials applied. During alternate periods when the amplifier is operating, the amplifier drift output sampling circuit is deactivated, eliminating any possibility of saturating the corrective-potential circuit.

In many applications of zero-corrected, direct-coupled amplifiers, the cessation of amplifying action during the drift sampling period is not objectionable. However, if continuous amplifying action is necessary the present invention is arranged in a reciprocal circuit, where a parallel pair of amplifiers alternately amplify and are corrected for zero drift.

It is an object of the present invention to provide an improved direct-coupled amplifier having zero level drift correction.

It is another object of the present invention to provide a direct-coupled amplifier having protection against overload saturation of the zero level drift correcting circuit.

It is another object to provide a continuously functioning direct-coupled amplifier having zero level drift corrected amplifiers.

The invention will be better understood by reference to the drawing in which there is shown a wiring diagram of the circuit as arranged to provide for continuous amplification.

Referring now to the drawing, there is shown an input terminal 11 and a ground, or chassis, potential terminal 12 for convenient coupling to a source of low amplitude signals to be amplified. An input resistor 13 couples the input terminal 11 to a first vibratory contactor 14 of a two section vibrator 16. An operating coil 17, driving both sections synchronously, is connected to a pair of alternating current supply terminals 18. The first vibratory contactor 14 is driven between a first and second contact 19 and 21, respectively.

In the following description and in the drawing, the components of a first and second reciprocally connected amplifiers 22 and 23 are correspondingly identical and will be similarly numbered. Therefore only the first amplifier 22 is described in detail, such description applying equally to the second amplifier 23.

The first contact 19 is connected to the control electrode of an input tube 24 in the first amplifier 22, such control electrode being coupled to ground potential through a grid resistor 26. The anode of the input tube 24 is connected to a direct current positive voltage bus 27. The cathode of the input tube 24 is connected to the cathode of an amplifier tube 28, the cathodes having a common cathode resistor 29 to ground for connecting the two tubes in a differential amplifier circuit. The anode operating potential for the amplifier tube 28 is supplied through an anode resistor 31 from the voltage bus 27. The control electrode of the amplifier tube 28 is coupled to ground through a capacitance 32, such capacitance having a value such as to generally filter any signals applied to the control electrode which vary at rates greater than drift potentials.

One or more cascaded direct-coupled amplifier stages 33, represented in block form, have an input connection 34 coupled to the anode of the amplifier tube 28. The circuitry represented by the block 33 may be of a conventional nature, providing the potentials at an output connection 36 are in phase with signals at the input terminal 11.

An output resistor 37 couples signals from the output connection 36 to an output terminal 38. A first and second voltage dividing resistor 39 and 41 are connected in series from the output connection 36 to ground or, in some circuits, to a source of negative bias. A negative feedback resistor 42 couples a drift cancelling signal from the juncture of the voltage divider resistors 39 and 41 to the control electrode of the amplifier tube 28.

The second section of the vibrator 16, physically identical to the first section, has a ground connected vibratory contactor 43, a third and fourth contact 44 and 46, and utilizes the driving coil 17. The third contact 44 is connected to the juncture of the voltage divider resistors 39 and 41, thus with activation of the driving coil 17 such juncture is periodically placed at a ground potential. Coupling between the input and output of the amplifiers is reduced by a grounded shield 47 between the two vibrator sections. Two separate vibrators might also be used with due consideration given to phasing of the driving coils.

It should be noted that the device as described up to this point might be used in situations where discontinuous amplification is permissible. If continuous output is required the second amplifier 23 is included.

Considering now the second amplifier 23, the control electrode of an input tube 24' is connected to the second contact 21 of the vibrator 16. Output signals at the output terminal 36' of a direct coupled amplifier stage 33' are connected through an output resistor 37' to combine with the output signals of the first amplifier 22 at the output terminal 38. The fourth contact 46 is connected to the juncture of a first and a second voltage divider resistor 39' and 41'.

Considering now the operation of the device, assume that operating potentials are provided and a signal is being applied to the input terminal 11. The two sections of the vibrator 16 are phased so that the vibratory contactors 14 and 43 simultaneously touch either the first and third contacts 19 and 44 or the second and fourth contacts 21 and 46. Taking the first condition, the input signal is applied to the first amplifier 22 and is available at the output terminal 38 in amplified form. The third contact 44 is at ground potential so no feedback voltage is applied to control electrode of the amplifier tube 28.

In the alternate position, the vibratory contactors touch the second and fourth contacts 21 and 46 and input signals are no longer applied to the first amplifier 22. Thus the control electrode of the input tube 24 is coupled to ground potential through the grid resistor 26. Any drift occurring within the first amplifier 22 appears at the output connection 36 and, since the third contact 44 is no longer grounded, output potentials are applied to the control electrode of the amplifier tube 28 as a negative feedback signal. Such feedback signal creates a charge on the capacitor 32, whereby the feedback signal is retained on the control electrode during the subsequent amplification period.

Interaction between the two amplifiers is minimized by selecting a high resistance for the output resistor 37 in relation to the impedance seen at the output connection 36.

It is generally impractical to attempt adjusting a vibrator so that the vibratory contactor instantly switches from one contact to the other without either an overlap period when both contacts are closed or an open period when both are open. In this instance an overlap period is provided for by the inclusion of the input resistor 13. If the grid resistors 26 and 26' both have approximately one-half the resistance of the input resistor 13, then during an overlap period when both amplifiers are amplifying, the input to each is reduced in amplitude and the output signal remains more nearly that provided by a single amplifier.

In operation, the device maintains stable operation under widely varying values of positive voltage from the voltage bus 27 or with the value of various resistors changed to simulate the effect of component aging. High overload input voltages result in no appreciable saturation.

While the invention has been disclosed with respect to a single preferred embodiment, it will be apparent to those skilled in the art that numerous variations and modifications may be made within the spirit and scope of the invention and thus it is not intended to limit the invention except as defined in the following claim.

What is claimed is:

In a direct-coupled amplification system, the combination comprising a power supply having a positive terminal and a negative terminal, a first and second differential amplifier, each such amplifier having a first tube with a cathode and anode and control electrode, each such differential amplifier further having a second tube with a cathode and anode and control electrode, each such differential amplifier having a cathode resistor connected from the negative terminal of said power supply to the cathodes of both the first and second tube, each such differential amplifier having the anode of said first tube coupled to the positive terminal of said power supply, an anode resistor in each of said differential amplifiers connected from the anode of said second tube to the positive potential terminal of said power supply, a first and a second direct-coupled amplifier each having an output terminal and each having an input terminal connected to the anode of the second tube in said first and second differential amplifiers respectively, a signal input connector for receiving signals to be amplified, a first vibratory switch having a first position coupling said input connector to the control electrode of the first tube in said first differential amplifier and having a second position coupling said input connector to the control electrode of the first tube in said second differential amplifier, a first and a second negative feedback circuit each coupled from the output terminal of each of said direct-coupled amplifiers to the control electrode of the second tube respectively in each of said differential amplifiers, a first and a second feedback signal storing capacitor each connected from the control electrode of the second tube in said first and second differential amplifier respectively to the negative terminal of said power supply, a second vibratory switch synchronously linked to said first vibratory switch and having a first position coupling said first feedback circuit to the negative terminal of said power supply and having a second position coupling said second feedback circuit to the negative terminal of said power supply, and a signal mixer circuit connected to the output terminals of said first and said second direct-coupled amplifiers and having an output connection providing thereon a continuous amplified representation of signals applied to said input connector.

References Cited in the file of this patent

UNITED STATES PATENTS

| | | |
|---|---|---|
| 2,459,730 | Williams | Jan. 18, 1949 |
| 2,471,252 | Toulon | May 24, 1949 |
| 2,741,668 | Iffland | Apr. 10, 1956 |
| 2,744,969 | Peterson | May 8, 1956 |

FOREIGN PATENTS

| | | |
|---|---|---|
| 1,011,936 | France | Apr. 9, 1952 |